United States Patent
Su et al.

(10) Patent No.: US 8,009,432 B2
(45) Date of Patent: Aug. 30, 2011

(54) RETAINING APPARATUS FOR A FLEXIBLE PRINTED CIRCUIT BOARD

(75) Inventors: Ying Su, Shenzhen (CN); Wei Huang, Shenzhen (CN); I-Hsien Chiang, Taoyuan (TW)

(73) Assignees: FuKui Precision Component (Shenzhen) Co., Ltd., Shenzhen, Guangdong Province (CN); Foxconn Advanced Technology Inc., Tayuan, Taoyuan (TW)

( * ) Notice: Subject to any disclaimer, the term of this patent is extended or adjusted under 35 U.S.C. 154(b) by 984 days.

(21) Appl. No.: 11/847,300

(22) Filed: Aug. 29, 2007

(65) Prior Publication Data

US 2008/0266819 A1    Oct. 30, 2008

(30) Foreign Application Priority Data

Apr. 27, 2007    (CN) .......................... 2007 1 0074234

(51) Int. Cl.
*H05K 5/00* (2006.01)
(52) U.S. Cl. ....................................... 361/752; 361/749
(58) Field of Classification Search .................. 361/749, 361/752, 756, 758, 760, 767; 439/69
See application file for complete search history.

(56) References Cited

U.S. PATENT DOCUMENTS

| 4,892,321 | A  | * | 1/1990  | Colgate et al. | 277/630 |
| 5,278,724 | A  | * | 1/1994  | Angulas et al. | 361/707 |
| 5,280,192 | A  | * | 1/1994  | Kryzaniwsky | 257/723 |
| 5,423,514 | A  |   | 6/1995  | Wakiyama et al. | |
| 5,550,712 | A  | * | 8/1996  | Crockett | 361/752 |
| 6,462,955 | B1 | * | 10/2002 | Roberts | 361/760 |
| 6,629,365 | B2 | * | 10/2003 | Denzene et al. | 29/841 |
| 6,819,562 | B2 | * | 11/2004 | Boudreaux et al. | 361/690 |
| 6,897,753 | B2 | * | 5/2005  | Dixon | 336/65 |
| 7,269,032 | B2 | * | 9/2007  | Lungwitz | 361/816 |
| 7,369,415 | B2 | * | 5/2008  | Kojima | 361/789 |
| 7,372,701 | B2 | * | 5/2008  | Jacobson et al. | 361/714 |
| 7,751,204 | B2 | * | 7/2010  | Wilber et al. | 361/818 |

* cited by examiner

*Primary Examiner* — Hung S Bui
(74) *Attorney, Agent, or Firm* — Jeffrey T. Knapp

(57) ABSTRACT

An exemplary mounting support for a flexible printed circuit board is provided. The flexible printed circuit board has a side surface and at least one electronic component mounted on the side surface. The mounting support includes a first surface for contacting with the side surface of the flexible printed circuit board and a second surface on an opposite side of the mounting support to the first surface. The mounting support has at least one first recess defined in the first surface for receiving the at least one electronic component therein and at least one through-hole defined through the first surface and the second surface. The mounting support has at least one second recess defined in the second surface. The mounting support can fix a double surface mounted flexible printed circuit board flatly, thereby enhancing laser processing precision.

8 Claims, 8 Drawing Sheets

RETAINING APPARATUS FOR A FLEXIBLE PRINTED CIRCUIT BOARD

BACKGROUND

1. Technical Field

The present invention relates to an mounting support for a flexible printed circuit board and a retaining apparatus having the mounting support.

2. Description of Related Art

Nowadays, electronic products have achieved ever greater levels of miniaturization in volume and diversification in function. Correspondingly, flexible printed circuit boards used in these electronic products have become smaller and smaller, and more and more complicated.

For the convenience of manufacturing, a flexible printed circuit board in a manufacturing process generally is classified into multiple electrical trace units. Each of electrical trace units belongs to a flexible printed circuit board unit. Thus, multiple flexible printed circuit board units can be manufactured simultaneously. After the flexible printed circuit board is manufactured and various electronic components are mounted thereon, laser processing such as a laser cutting is performed so as to separate the multiple flexible printed circuit board units according to the electrical trace units. Because the flexible printed circuit board is flexible and light in weight, the flexible printed circuit board can be held in place using a vacuum device of laser processing apparatus. Then, a laser beam produced by the laser processing apparatus cuts the flexible printed circuit board according to the electrical trace units, thereby separating the flexible printed circuit board into the multiple flexible printed circuit board units.

In order to ensure stable positioning under vacuum suction of the flexible printed circuit board onto the vacuum device, a contact surface of the flexible printed circuit board to be sucked by the vacuum device must be adequately flat. However, when the flexible printed circuit board is a double surface mounted flexible printed circuit board (i.e., two opposite surfaces of the flexible printed circuit board have electronic components mounted thereon), each of the two surfaces of the flexible printed circuit boards is unsmooth due to the electronic components mounted thereon. Thus, the double surface mounted flexible printed circuit board cannot be fixed on the vacuum device stably, thereby affecting laser processing precision. Furthermore, when the double surface mounted flexible printed circuit board is fixed on the vacuum device directly, the electronic components mounted may be damaged and/or removed.

What is needed, therefore, is a mounting support that is capable of retaining a double surface mounted flexible printed circuit board to process using a laser beam.

SUMMARY

One preferred embodiment provides a mounting support for retaining a flexible printed circuit board. The flexible printed circuit board has a side surface and at least one electronic component mounted on the side surface. The mounting support includes a first surface for contacting with the side surface of the flexible printed circuit board and a second surface on an opposite side of the mounting support to the first surface. The mounting support has at least one first recess defined in the first surface for receiving the at least one electronic component therein and at least one through-hole penetrating the first surface and the second surface. The mounting support has at least one second recess defined in the second surface.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, like reference numerals designate corresponding parts throughout the several views.

DETAILED DESCRIPTION OF THE EMBODIMENTS

Embodiments will now be described in detail below and with reference to the drawings.

Figure 1:
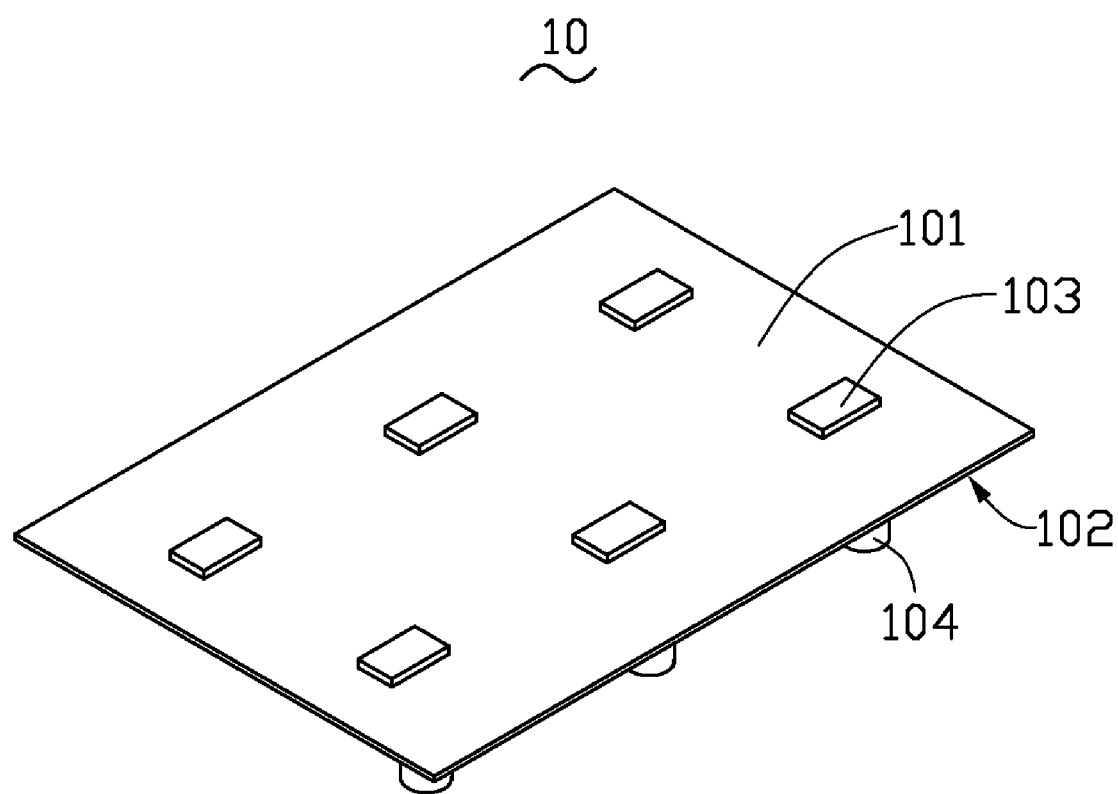
FIG. 1 is a schematic view of a double surface mounted flexible printed circuit board.

In FIG. 1, a flexible printed circuit board 10 is shown. The flexible circuit board 10 is a double surface mounted flexible printed circuit board. The flexible printed circuit board 10 includes a first mounting surface 101 and an opposite second mounting surface 102. The first mounting surface 101 has a number of first electronic components 103 mounted thereon. The second mounting surface 102 has a number of second electronic components 104 mounted thereon. The first electronic components 103 can be different from the second electronic components 104. Each of the first electronic components 103 can be different and each of the second electronic components 104 can also be different. For purpose of illustration only, the first electronic components 103 in the present embodiment have a rectangular parallelepiped configuration, and the second electronic components 104 have a cylindrical configuration. It is understood that the first electronic components 103 and the second electronic components 104 may have other shapes.

Figure 2:
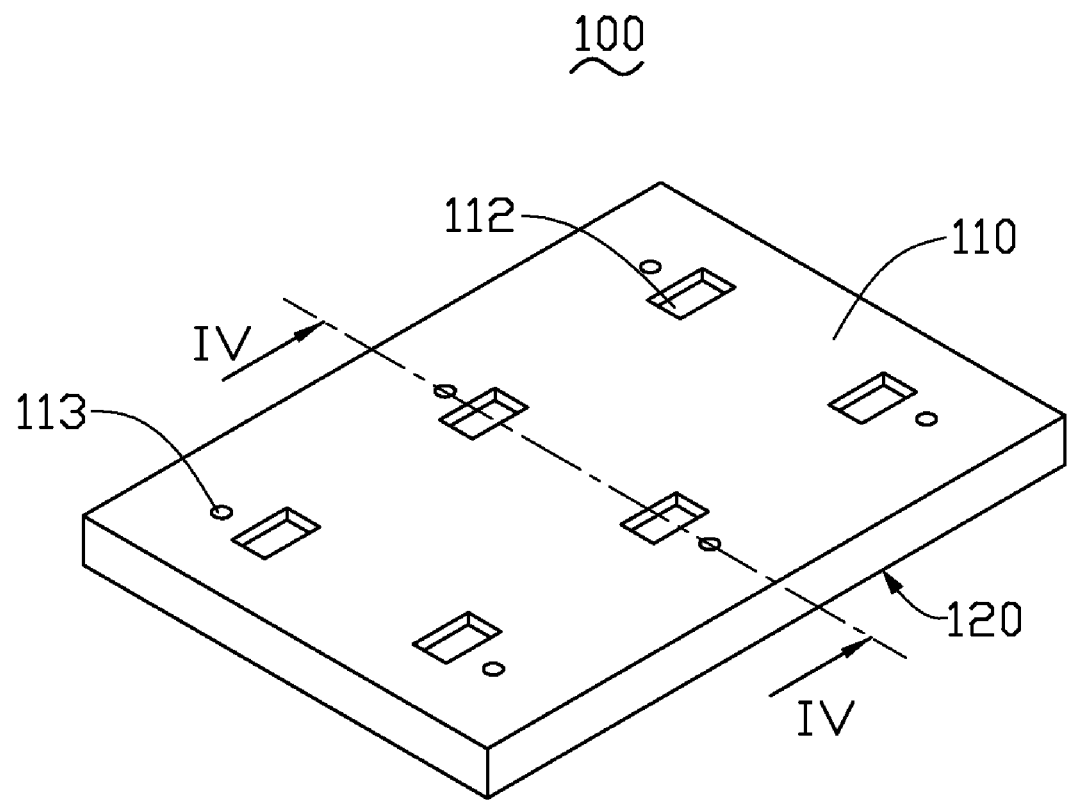
FIG. 2 is a schematic view of a mounting support for retaining a flexible printed circuit board according to a first exemplary preferred embodiment, which mainly shows a first surface of the mounting support.
Figure 3:
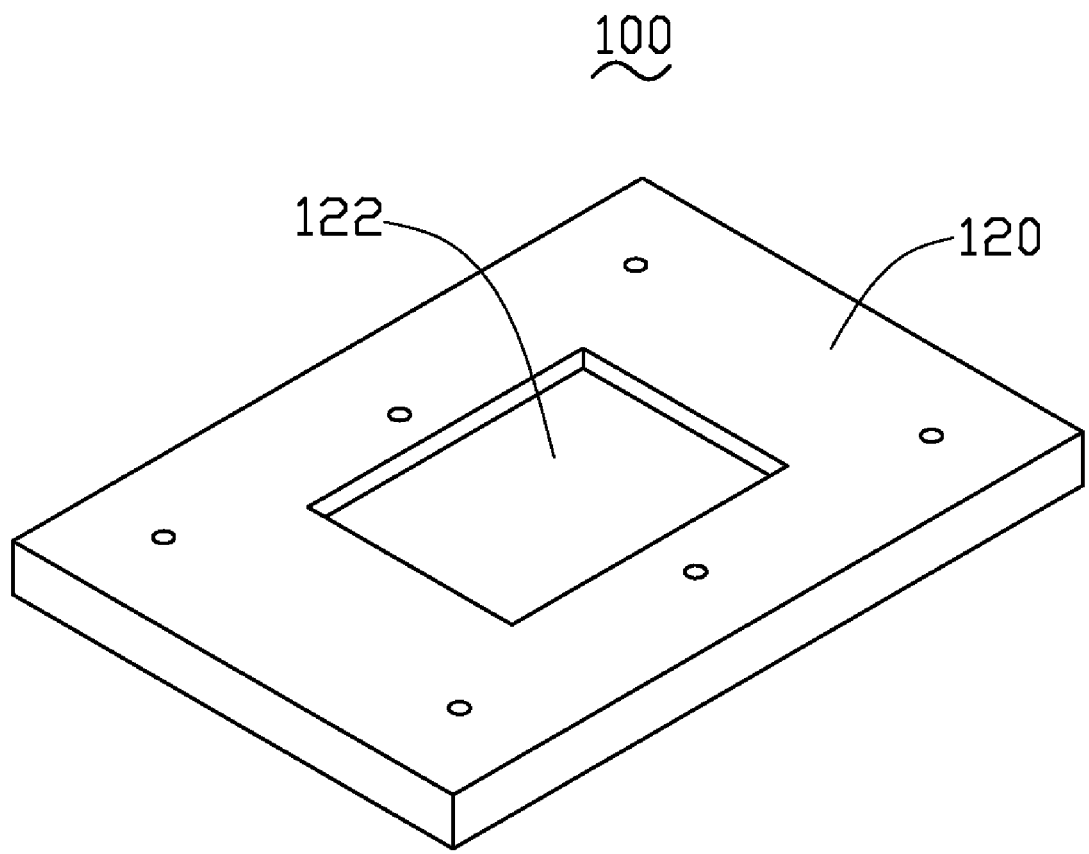
FIG. 3 is a schematic view of the mounting support of FIG. 2, which mainly shows a second surface of the mounting support.
Figure 4:
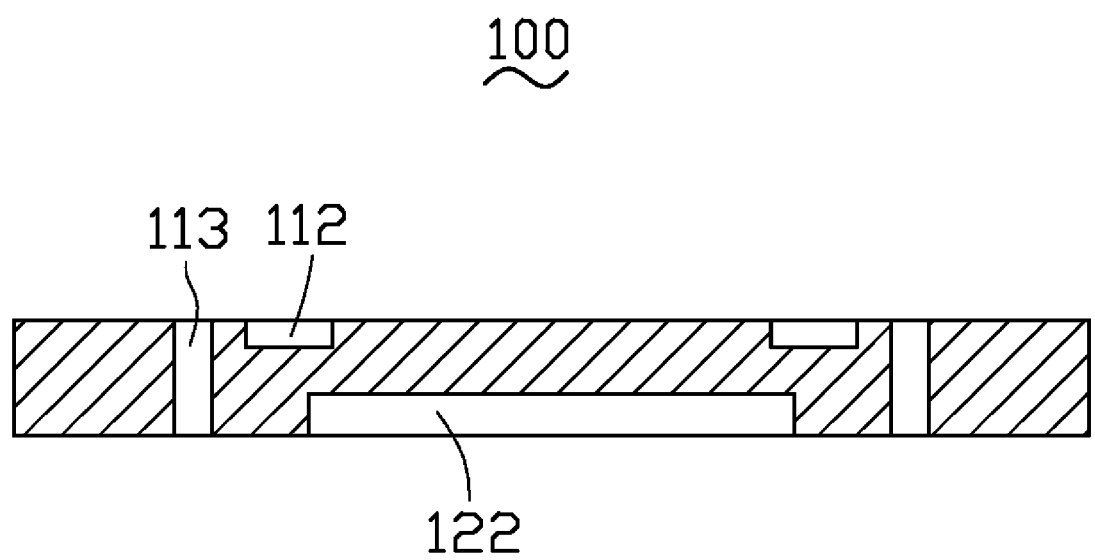
FIG. 4 is a schematic, cross-sectional view of the mounting support of FIG. 2 as viewed along line IV-IV.

In FIG. 2 to FIG. 4, a mounting support 100 for retaining the flexible printed circuit board 10 is shown. The mounting support 100 can be designed to come into contact with the first mounting surface 101 having the first electronic components 103 mounted thereon, or to come into contact with the second mounting surface 102 having the second electronic components 104 mounted thereon. In the first exemplary preferred embodiment, the mounting support 100 is designed to come into contact with the first mounting surface 101 having the first electronic components 103 mounted thereon.

The mounting support 100 is board-shaped. The mounting support 100 can be made of metals, such as copper, aluminum, iron and alloys thereof, or organic composites such as polytetrafluoroethylene (PTFE), etc. In the first preferred embodiment, the mounting support 100 is an aluminum board with flat surfaces, i.e., a first surface 110 and a second surface 120 on an opposite side of the mounting support 100. The first surface 110 is parallel to the second surface 120.

The mounting support 100 has a number of first recesses 112 and a number of through-holes 113 defined in the first surface 110. The first recesses 112 are configured for receiving the first electronic components 103 mounted on the first mounting surface 101 of the flexible printed circuit board 10. Each of the first recesses 112 corresponds to one of the first electronic components 103. Dimension, configuration and distribution of the first recesses 112 are mated with that of the first electronic components 103 mounted on the flexible printed circuit board 10. Advantageously, for the convenience of placing and taking the first electronic components 103, the size of the first recesses 112 can be a little larger than that of the first electronic components 103. In the first preferred embodiment, each of the first recesses 112 has a rectangular parallelepiped configuration so as to receive the first electronic components 103 with a rectangular parallelepiped configuration.

The through-holes 113 are defined through the first surface 110 and the second surface 120. The through-holes 113 may be defined at any position other than the first recesses 112. The though-holes 113 may have a cross-section of circular, square, rectangular, or other irregular shape. In the first exemplary preferred embodiment, a cross-section of each of the though-holes 113 taken normal to the second surface 120 is circular. Each of the through-holes 113 is located adjacent to the respective first recesses 112. Advantageously, the through-holes 113 are arranged so as to surround the first recesses 113 uniformly on the first surface 110.

The mounting support 100 has a second recess 122 defined in the second surface 120. The second recess 122 may be located at a desired position. A cross-section of the second recess 122 taken normal to the second surface 120 may be circular, square, rectangular, annular or other irregular shape. A sum of a depth of the second recess 122 and a depth of any one of the first recess 112 should be less than a distance from the first surface 110 to the second surface 120 of the mounting support 100 in order to ensure that the second recess 122 does not communicate with the corresponding first recess 112. In other words, the first recesses 112 defined in the first surface 110 should not communicate with the second recess 122 defined in the second surface 120. In the first exemplary preferred embodiment, the second recess 122 is in the middle of the second surface 120. A cross-section of the second recess 122 taken normal to the second surface 120 is square. The through-holes 113 defined through the first surface 110 and the second surface 120 are arranged so as to surround the second recess 122 uniformly on the second surface 120.

Figure 5:
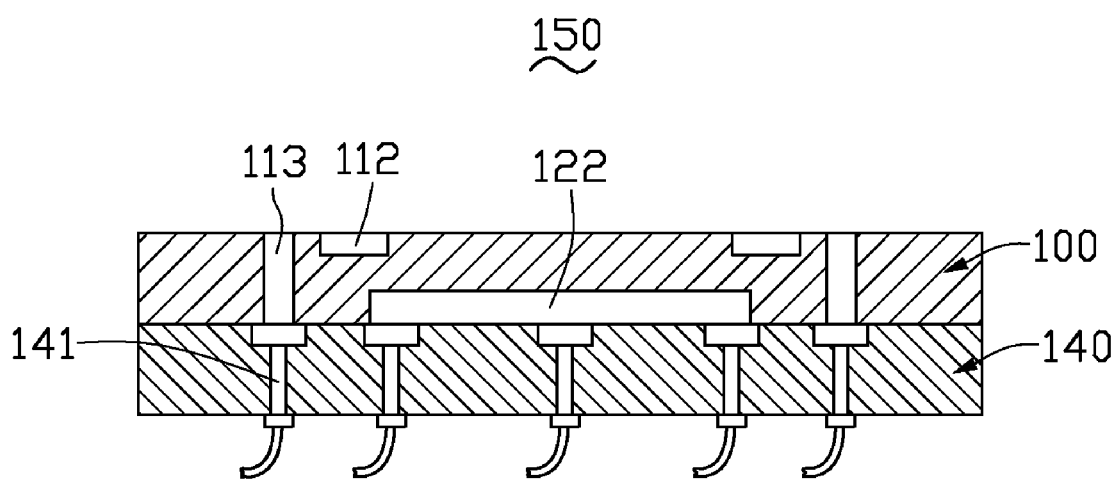
FIG. 5 is a schematic, cross-sectional view of an apparatus including the mounting support of FIG. 2.

In FIG. 5, a retaining apparatus 150 including the mounting support 100 and the vacuum device 140 is shown. The vacuum device 140 has a number of vacuum inlets 141 therein. The mounting support 100 is disposed on the vacuum device 140. The second surface 120 of the mounting support 100 contacts with the vacuum device 140. The through-holes 113 and the second recess 122 communicate with the vacuum inlets 141.

In use, the flexible printed circuit board 10 is placed on the mounting support 100 with the first mounting surface 101 having the first electronic components 103 mounted thereon. The first electronic components 103 mounted on the first mounting surface 101 are received in the corresponding first recesses 112, and thus the flexible printed circuit board 10 is supported by the mounting support 100 flatly. The through-holes 113 provide suction channels extending from the flexible printed circuit board 10 to the vacuum inlets 141 of the vacuum device 140. In this way the flexible printed circuit board 10 is held on the mounting support 100 firmly when a vacuum sucking force produced by the vacuum device 140 is applied to the flexible printed circuit board 10 via the through-holes 113. In the first exemplary preferred embodiment, the through-holes 113 are arranged to surround the first recesses 112 and are distributed uniformly so that the vacuum sucking force can be distributed uniformly. Thus the flexible printed circuit board 10 and flexible printed circuit boards cut from the flexible printed circuit board 10 can be fixed on the mounting support 100 flatly and firmly well. Meanwhile, air in the second recess 122 is removed using the vacuum device 140 through the vacuum inlets 141. Thus vacuum sucking force acting on the mounting support 100 can be increased, thereby fixing the mounting support 100 on the vacuum device 140 firmly.

Figure 6:
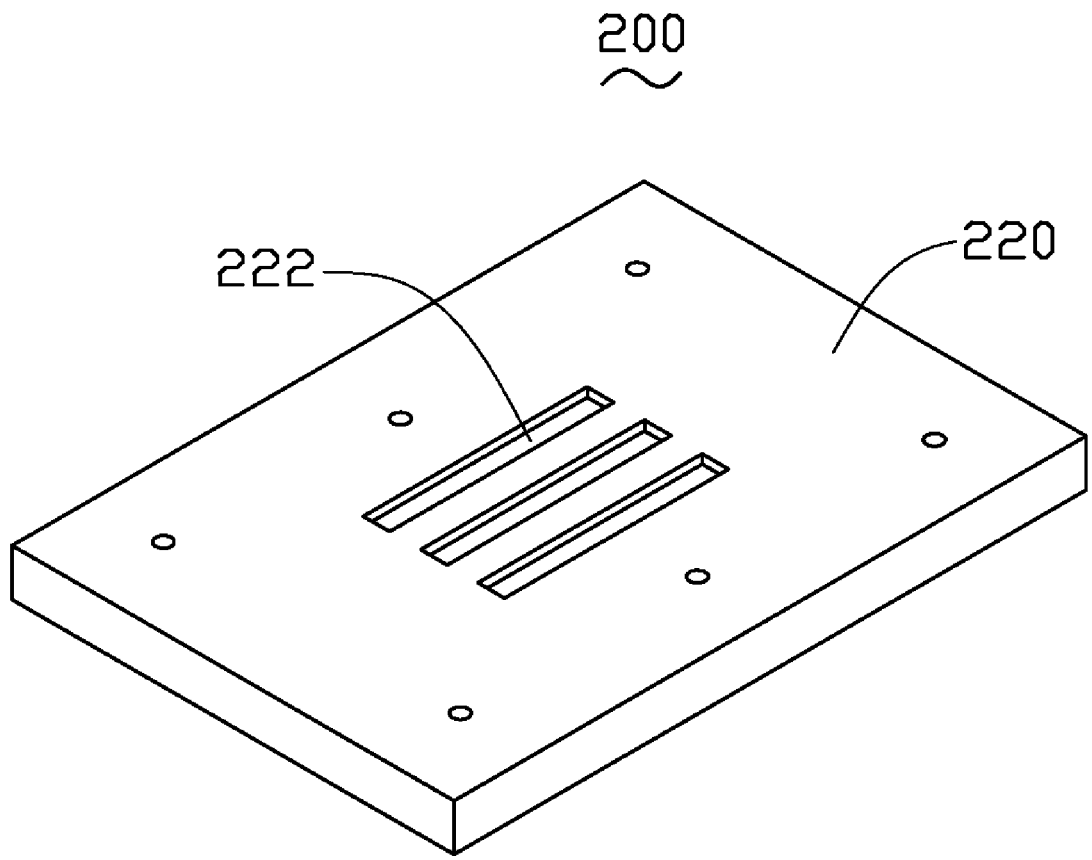
FIG. 6 is a schematic view of a mounting support for retaining a flexible printed circuit board according to a second exemplary preferred embodiment, which mainly shows a second surface of the mounting support.

In FIG. 6, a mounting support 200 for retaining the flexible printed circuit board 10 according to a second exemplary embodiment is shown. The mounting support 200 is similar to the mounting support 100 in the first exemplary embodiment except that the second surface 220 defines a number of second recesses 222 therein.

A cross-section of each of the second recesses 222 taken normal to the second surface 220 can be circular, square, rectangular, annular or other irregular shape. Each of the second recesses 222 can have essentially identical configuration and essentially identical depth. The second recess 222 does not communicate with the first recess. If one of the second recesses 222 does not correspond to any first recess in position, a depth of the one second recess 222 can be less than a distance from the first surface 210 to the second surface 220 of the mounting support 200. In the second exemplary preferred embodiment, a cross-section each of the second recesses 222 taken normal to the second surface 220 is rectangular. The second recesses 222 are in the middle of the second surface 220 and arranged in a parallel manner. Each of the second recesses 222 has essentially identical depth and does not communicate with the corresponding first recesses.

Figure 7:
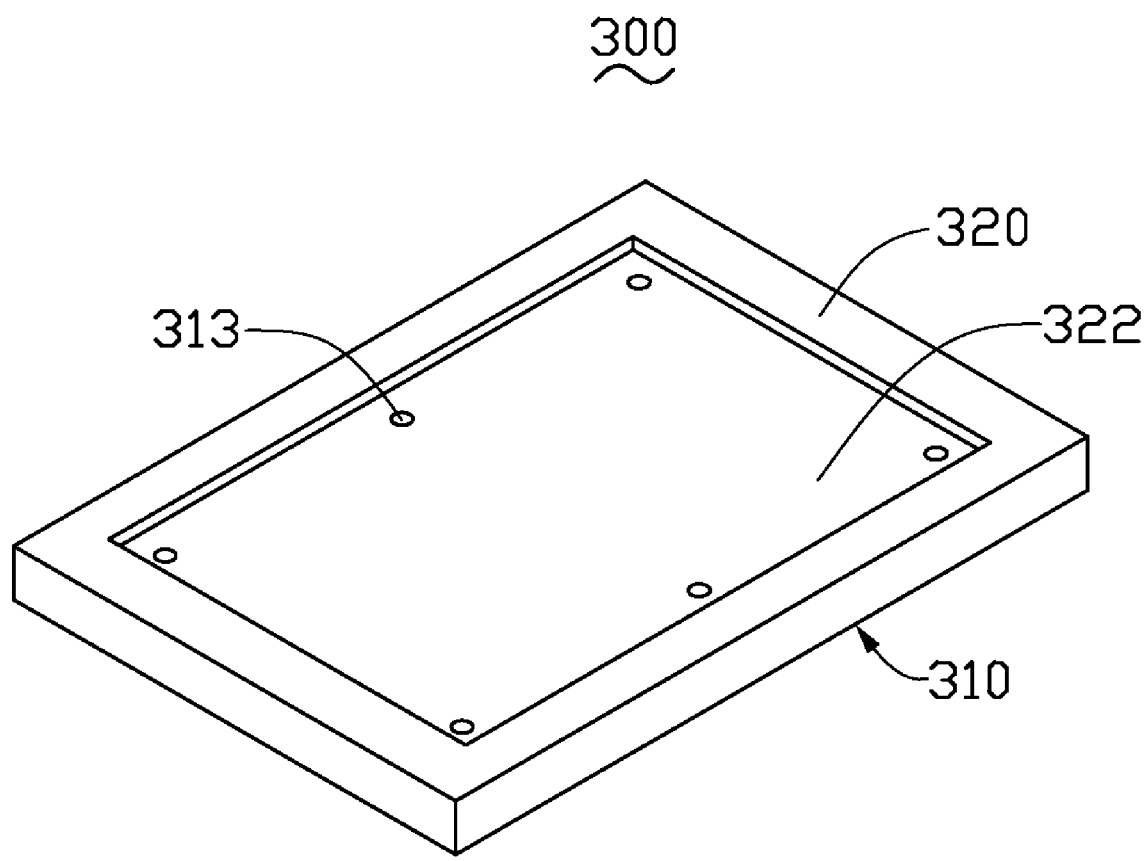
FIG. 7 is a schematic view of a mounting support for retaining a flexible printed circuit board according to a third exemplary preferred embodiment, which mainly shows a second surface of the mounting support.

In FIG. 7, a mounting support 300 for retaining the flexible printed circuit board 10 according to a third exemplary embodiment is shown. The mounting support 300 is similar to the mounting support 100 in the first exemplary embodiment except that the second surface 320 defines a larger second recess 322 therein. Because the second recess 322 is large in size, all the through-holes 313 communicate with the second recess 322. It can be understood that only one or some of the through-holes 313 communicate with the second recess 322 according to different shapes of the second recess 322.

Figure 8:
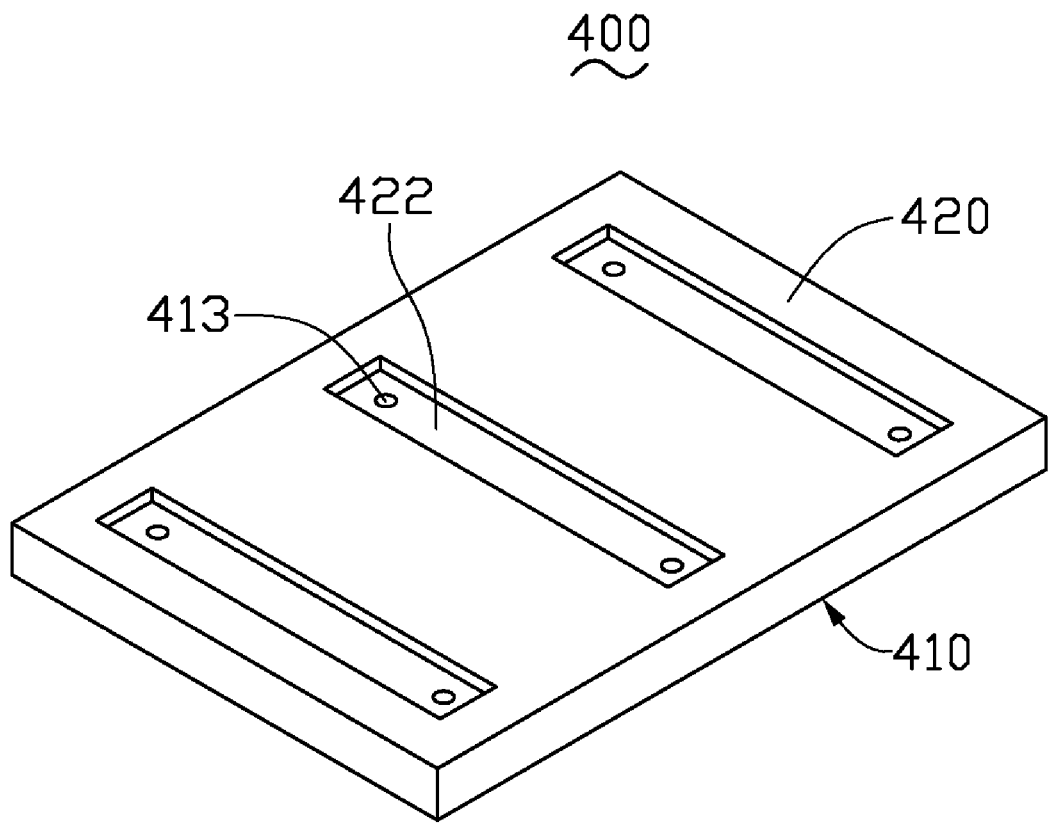
FIG. 8 is a schematic view of a mounting support for retaining a flexible printed circuit board according to a fourth exemplary preferred embodiment, which mainly shows a second surface of the mounting support.

In FIG. 8, a mounting support 400 for laser processing the flexible printed circuit board 10 according to a fourth exemplary embodiment is shown. The mounting support 400 is similar to the mounting support 100 in the first exemplary embodiment except that the second surface 420 defines a number of second recesses 422 therein and all the through-holes 413 communicate with the second recesses 422. In the fourth exemplary preferred embodiment, a cross-section of each of the second recesses 422 taken normal to the second surface 420 is rectangular. The second recesses 422 are arranged parallel to each other. Each of the second recesses 422 has essentially identical depth and does not communicate with the corresponding first recesses. Each of the second recesses 422 communicates with two of the through-holes 413. According to different shapes of the second recesses 422, maybe some of the through-holes 413 communicate with some of the second recesses 422.

While certain embodiments have been described and exemplified above, various other embodiments will be apparent to those skilled in the art from the foregoing disclosure. The present invention is not limited to the particular embodiments described and exemplified but is capable of considerable variation and modification without departure from the scope of the appended claims.

What is claimed is:

1. A retaining apparatus for a flexible printed circuit board, the flexible printed circuit board comprising a first mounting surface with at least one first electronic component mounted thereon and an opposite second mounting surface with at least one second electronic component mounted thereon, the apparatus comprising:

a mounting support having a first surface and a second surface on an opposite side of the mounting support to the first surface, the first surface being configured for contacting with the first mounting surface of the flexible printed circuit board, the mounting support having at least one first recess defined in the first surface and at least one through-hole defined through the first surface and the second surface, the at least one first recess being configured for receiving the at least one first electronic component therein, the mounting support having at least one second recess defined in the second surface, the at least one second recess being not in communication with the at least one first recess and being configured for receiving the at least one second electronic component therein, wherein the flexible printed circuit board can be flatly mounted on the mounting support in a manner such that the first surface directly contacts with the first mounting surface and the at least one first electronic component is received in the at least one first recess, or such that the second surface directly contacts with the second mounting surface and the at least one second electronic component is received in the at least one second recess; and a vacuum device having a vacuum inlet for being brought into contact with the second surface of the mounting support, the at least one through-hole and the at least one second recess being in communication with the vacuum inlet.

2. The retaining apparatus as claimed in claim 1, wherein a sum of a depth of the at least one second recess and a depth of the at least one first recess is less than a distance from the first surface to the second surface of the mounting support.

3. The retaining apparatus as claimed in claim 1, wherein the at least one first recess includes a plurality of first recesses and the at least one through hole includes a plurality of through-holes, the through-holes being located adjacent to the respective first recesses.

4. The retaining apparatus as claimed in claim 3, wherein at least one of the through-holes communicates with the at least one second recess.

5. The retaining apparatus as claimed in claim 3, wherein the at least one second recess includes a plurality of second recesses, at least one of the through-holes communicating with at least one of the second recesses.

6. The retaining apparatus as claimed in claim 5, wherein the second recesses have an essentially identical configuration.

7. The retaining apparatus as claimed in claim 5, wherein the second recesses have an essentially identical depth.

8. The retaining apparatus as claimed in claim 5, wherein the second recesses are parallel to each other.

* * * * *